(12) United States Patent
Min et al.

(10) Patent No.: US 8,054,667 B2
(45) Date of Patent: Nov. 8, 2011

(54) MULTILEVEL ONE-TIME PROGRAMMABLE MEMORY DEVICE

(75) Inventors: Dong-ki Min, Seoul (KR); Hoon-sang Oh, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 13 days.

(21) Appl. No.: 12/634,166

(22) Filed: Dec. 9, 2009

(65) Prior Publication Data

US 2010/0177548 A1  Jul. 15, 2010

(30) Foreign Application Priority Data

Jan. 14, 2009  (KR) .............................. 2009-0002975

(51) Int. Cl.
*G11C 17/00* (2006.01)
*G11C 7/00* (2006.01)

(52) U.S. Cl. ................ 365/96; 365/225.7; 365/189.011; 365/175

(58) Field of Classification Search ..................... 365/96, 365/189.011, 175, 225.07
See application file for complete search history.

(56) References Cited

U.S. PATENT DOCUMENTS

| 5,886,392 | A | 3/1999 | Schuegraf | |
|---|---|---|---|---|
| 6,356,496 | B1 * | 3/2002 | Carroll et al. | ............... 365/225.7 |
| 6,507,053 | B1 | 1/2003 | Bernard et al. | |
| 6,535,418 | B2 * | 3/2003 | Hogan | ........................... 365/175 |
| 7,613,913 | B2 * | 11/2009 | Haban et al. | ...................... 713/1 |
| 2005/0087836 | A1 | 4/2005 | Wu | |
| 2006/0006494 | A1 | 1/2006 | Wu | |

* cited by examiner

*Primary Examiner* — Huan Hoang
*Assistant Examiner* — Tri Hoang
(74) *Attorney, Agent, or Firm* — F. Chau & Associates, LLC (57) ABSTRACT

A multilevel one-time programmable memory device includes a plurality of memory cells, wherein each of the plurality of memory cells includes: a first electrode to which a first voltage is applied, a second electrode to which a second voltage is applied and a plurality of fuse lines performing a fusing operation according to a voltage difference between the first electrode and the second electrode. The plurality of fuse lines are connected to each other between the first electrode and the second electrode. In addition, at least one of the first electrode and the second electrode is formed such that the first electrode and the second electrode have different valid line lengths from each other therebetween so that the plurality of fuse lines have different resistances from each other.

11 Claims, 9 Drawing Sheets

| STATE | WRITE VOLTAGE SIZE | CONNECTED FUSE LINES | CURRENT SIZE |
|---|---|---|---|
| 0 | $0 < V_{wrt} < V_1$ | FL1, FL2, FL3 | $I_0 = V_{wrt}(G_1+G_2+G_3)$ |
| 1 | $V_1 < V_{wrt} < V_2$ | FL2, FL3 | $I_1 = V_{wrt}(G_2+G_3)$ |
| 2 | $V_2 < V_{wrt} < V_3$ | FL3 | $I_2 = V_{wrt}G_3$ |
| 3 | $V_3 < V_{wrt}$ | NOTHING | $I_3 = 0$ |

MULTILEVEL ONE-TIME PROGRAMMABLE MEMORY DEVICE

CROSS-REFERENCE TO RELATED APPLICATIONS

This application claims priority to Korean Patent Application No. 10-2009-0002975, filed on Jan. 14, 2009, the disclosure of which is hereby incorporated by reference herein in its entirety.

BACKGROUND (i) Technical Field

The inventive concept relates to a semiconductor memory device, and more particularly, to a one-time programmable memory device having a low cost large area or stacked structure.

(ii) Description of the Related Art

It is difficult for conventional one-time programmable memory devices to have a large area and a stacked structure at low cost. Thus, there is a need in the art for a multilevel one-time programmable memory device which can be readily realized at high density and low cost.

SUMMARY

In accordance with an exemplary embodiment of the inventive concept, a multilevel one-time programmable memory device is provided. The multilevel one-time programmable memory device includes a plurality of memory cells, wherein each of the plurality of memory cells includes: a first electrode to which a first voltage is applied, a second electrode to which a second voltage is applied, and a plurality of fuse lines performing a fusing operation according to a voltage difference between the first electrode and the second electrode. The plurality of fuse lines are connected to each other between the first electrode and the second electrode.

In addition, at least one of the first electrode and the second electrode is formed such that the first electrode and the second electrode have different valid line lengths from each other therebetween so that the plurality of fuse lines have different resistances from each other.

One surface of the first electrode that faces the second electrode may have a stair shape. One surface of the first electrode that faces the second electrode may have an inclined shape.

In accordance with another exemplary embodiment of the inventive concept, a multilevel one-time programmable memory device is provided. The multilevel one-time programmable memory device includes a plurality of memory cells, wherein each of the plurality of memory cells include: a first electrode to which a first voltage is applied, a second electrode to which a second voltage is applied; and a plurality of fuse lines performing a fusing operation according to a voltage difference between the first electrode and the second electrode. The plurality of fuse lines are connected to each other between the first electrode and the second electrode in a multilayer structure, and the plurality of fuse lines have different resistances from each other.

At least one of the first electrode and the second electrode may be formed such that the first electrode and the second electrode have different valid line lengths from each other therebetween so that the plurality of fuse lines have different resistance ratios from each other. One surface of the first electrode that faces the second electrode may have a stair shape.

The plurality of fuse lines may have different areas or resistance ratios.

Each of the plurality of memory cells may further include: a diode connecting one of the first electrode and the second electrode and a corresponding word line among a plurality of word lines of the multilevel one-time programmable memory device.

In accordance with exemplary embodiment of the inventive concept, a multilevel one-time programmable memory device is provided. The multilevel one-time programmable memory device includes a plurality of memory cells, wherein each of the plurality of memory cells includes: a first electrode to which a first voltage is applied, a second electrode to which a second voltage is applied and a plurality of fuse lines operating an anti-fusing operation according to a voltage difference between the first electrode and the second electrode. The plurality of fuse lines are connected to each other between the first electrode and the second electrode, and wherein at least one of the first electrode and the second electrode is formed such that the first electrode and the second electrode have different valid line lengths from each other therebetween so that the plurality of fuse lines have different resistances from each other.

In accordance with another exemplary embodiment of the inventive concept, a memory system device is provided. The memory system device includes: a multilevel one-time programmable memory device which includes a plurality of memory cells, wherein each of the plurality of memory cells comprises:
 a first electrode to which a first voltage is applied;
 a second electrode to which a second voltage is applied; and
 a plurality of fuse lines performing a fusing operation according to a voltage difference between the first electrode and the second electrode, wherein the plurality of fuse lines are connected to each other between the first electrode and the second electrode in a multilayer structure, and wherein the plurality of fuse lines have different resistances from each other. The memory system device further includes a memory controller controlling an operation of writing data to the multilevel one-time programmable memory device and an operation of reading the data from the multilevel one-time programmable memory device.

BRIEF DESCRIPTION OF THE DRAWINGS

Exemplary embodiments of the inventive concept can be more clearly understood from the following detailed description taken in conjunction with the accompanying drawings in which.

DETAILED DESCRIPTION OF THE EXEMPLARY EMBODIMENTS

The attached drawings for illustrating preferred embodiments of the inventive concept are referred to for gaining a sufficient understanding of the inventive concept, the merits thereof, and the objectives accomplished by the implementation of the inventive concept.

The inventive concept will now be described more fully with reference to the accompanying drawings, in which exemplary embodiments of the invention are shown. Like reference numerals in the drawings denote like elements.

Figure 1:
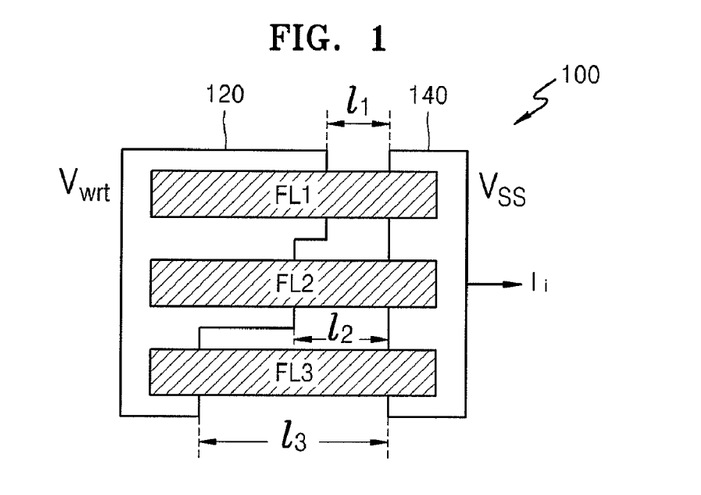
FIG. 1 is a view of a memory cell structure of a multilevel one-time programmable memory device according to an exemplary embodiment of the inventive concept.

FIG. 1 is a view of a memory cell structure of a multilevel one-time programmable memory device according to an embodiment of the inventive concept.

Referring to FIG. 1, a memory cell 100 includes a first electrode 120 and a second electrode 140, and a plurality of fuse lines FL1, FL2, and FL3 that are connected to each other in parallel between the first electrode 120 and the second electrode 140. A write voltage Vwrt may be applied to the first electrode 120, and a ground voltage Vss may be applied to the second electrode 140 to write data in the memory cell 100 of the multilevel one-time programmable memory device.

The fuse lines FL1, FL2, and FL3 have fusing or anti-fusing functions. For convenience of description, the fuse lines FL1, FL2, and FL3 operate as fuses. For example, the fuse lines FL1, FL2, and FL3 may be fused by a current Ii generated due to a voltage difference between the first electrode 120 and the second electrode 140. It would be obvious to one of ordinary skill in the art that the fuse lines FL1, FL2, and FL3 may be operated as anti-fuses in view of the following description of the fuse lines FL1, FL2, and FL3 operating as fuses.

If the write voltage Vwrt is applied to the first electrode 120, a data value corresponding to a resistance formed by the fuse lines FL1, FL2, and FL3, which are electrically connected to each other between the first electrode 120 and the second electrode 140, is written onto the memory cell 100 of the multilevel one-time programmable memory device. The memory cell 100 of the multilevel one-time programmable memory device shown in FIG. 1 includes the three fuse lines FL1, FL2, and FL3, which are connected to each other between the first electrode 120 and the second electrode 140.

Figure 2:
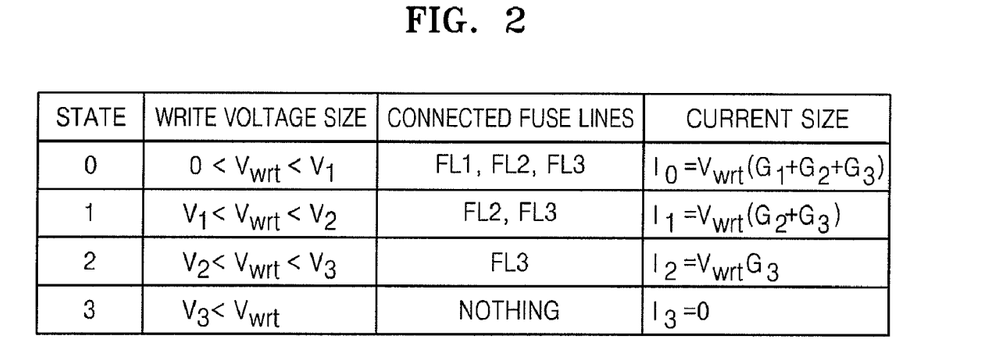
FIG. 2 is a table indicating the state condition of the memory cell shown in FIG. 1.

Therefore, referring to FIG. 2, which illustrates a table indicating the state condition of the memory cell 100 shown in FIG. 1, the memory cell 100 of the multilevel one-time programmable memory device may have four different states according to whether the fuse lines Fl1, Fl2, and Fl3 are fused. That is, the memory cell 100 of the multilevel one-time programmable memory device may have a data value of 2 bits.

Referring to FIGS. 1 and 2, the fuse lines FL1, FL2, and FL3 included in the memory cell 100 of the multilevel one-time programmable memory device have different resistances. The resistances of the fuse lines FL1, FL2, and FL3 correspond to valid line lengths l1, l2, and l3, respectively, according to a distance between the first electrode 120 and the second electrode 140 to which the fuse lines FL1, FL2, and FL3 are connected. Referring to FIG. 1, the fuse lines FL1, FL2, and FL3 have different resistances according to the first electrode 120 having a stair shape.

Among the fuse lines FL1, FL2, and FL3 included in the memory cell 100 of the multilevel one-time programmable memory device, the valid line length l1 of the first fuse line FL1 is the shortest, and the valid line length l3 of the third fuse line FL3 is the longest according to the first electrode 120 having the stair shape. If the valid line length l3 of the third fuse line FL3 is "l", the shape of the first electrode 120 may be determined in such a way that the valid line length l1 of the first fuse line FL1 and the valid line length l2 of the second fuse line FL2 are "l/3" and "l/2", respectively.

A conductance $G_k$ of each of the fuse lines FL1, FL2, and FL3 may be determined according to the valid line lengths l1, l2, and l3 by using, for example, equation 1 below, $$G_k = A/(\rho l_k), k=1,2,3 \qquad (1)$$

wherein, "A" denotes an area of each of the fuse lines FL1, FL2, and FL3, "ρ" denotes a resistance ratio of the fuse lines FL1, FL2, and FL3, and "$l_k$" denotes the valid line lengths l1, l2, and l3 of the fuse lines FL1, FL2, and FL3. That is, the conductance $G_k$ of each of the fuse lines FL1, FL2, and FL3 is in inverse proportion to the valid line lengths l1, l2, and l3. Therefore, the conductance $G_k$ of the first fuse line FL1 is the greatest, and the conductance $G_k$ of the third fuse line FL3 is the smallest.

In this regard, when the valid line lengths l1, l2, and l3 of the fuse lines FL1, FL2, and FL3 are "l/3", "l/2", and "l", respectively, as mentioned above, and if the conductance $G_k$ of the third fuse line FL3 is "G", the conductance $G_k$ of the first fuse line FL1 and the conductance $G_k$ of the second fuse line FL2 may be "3G" and "2G".

As the conductance (resistance) of the fuse lines FL1, FL2, and FL3 are different from each other, rating voltages used to change the state of the fuse lines FL1, FL2, and FL3 (whether the fuse lines FL1, FL2, and FL3 are fused) have different sizes. For example, if a rating voltage V1 of the first fuse line FL1 is applied to the first electrode 120, the state of the first fuse line FL1 is changed, if a rating voltage V2 of the second fuse line FL2 is applied to the first electrode 120, the states of the first and second fuse lines FL1 and FL2 are changed, and if a rating voltage V3 of the third fuse lines FL3 is applied to the first electrode 120, the states of the fuse lines FL1, FL2, and FL3 are changed.

That is, the memory cell 100 may have four states according to the size of the write voltage Vwrt applied to the first electrode 120 as shown in FIG. 2.

In more detail, if the write voltage Vwrt having a smaller size than the rating voltage V1 of the first fuse line FL1 is applied to the first electrode 120, the fuse lines FL1, FL2, and FL3 are not fused, which indicates the state "0".

However, the size of the current Ii generated from the first electrode 120 to the second electrode 140 may be determined by using, for example, equation 2 below.

$$I = Vwrt \Sigma G_k \quad (2)$$

Therefore, a first current I0 generated in the state "0" is the same as a value (I0=Vwrt(G1+G2+G3)) obtained by multiplying the write voltage Vwrt with a value (G1+G2+G3) obtained by summing the conductance of each of the fuse lines FL1, FL2, and FL3.

If the write voltage Vwrt having a size between the rating voltage V1 of the first fuse line FL1 and the rating voltage V2 of the second fuse line FL2 is applied to the first electrode 120, the first fuse line FL1 is fused, whereas the second and third fuse lines FL2 and FL3 are not fused. This indicates a state "1". Therefore, a second current I1 generated in the state "1" is the same as a value (I1=Vwrt(G2+G3)) obtained by multiplying the write voltage Vwrt with a value (G2+G3) obtained by summing the conductance of each of the second and third fuse lines FL2 and FL3.

Likewise, if the write voltage Vwrt having a size between the rating voltage V2 of the second fuse line FL2 and the rating voltage V3 of the third fuse line FL3 is applied to the first electrode 120, the first and second fuse lines FL1 and FL2 are fused, whereas the third fuse line FL3 is not fused. This indicates a state "2". Therefore, a third current I2 generated in the state "2" is the same as a value (I0=Vwrt(G3)) obtained by multiplying the write voltage Vwrt with the conductance of the third fuse line FL3.

Finally, if the write voltage Vwrt having a greater size than the rating voltage V3 of the third fuse line FL3 is applied to the first electrode 120, the fuse lines FL1, FL2, and FL3 are fused. This indicates a state "3". A fourth current I3 generated in the state "3" has a value "0".

The size of the first current I0 through the fourth current I4 corresponding to the states "0" through "3" of the memory cell 100 of the multilevel one-time programmable memory device is determined by using equation 3 below, $$I3 < I2 < I1 < I1 \quad (3)$$

Therefore, the multilevel one-time programmable memory device can detect the states of the fuse lines FL1, FL2, and FL3 from different current values according to the states "0" through "3" of the memory cell 100. The multilevel one-time programmable memory device may ensure that the first current I0 through the fourth current I4 have the same interval shown in FIG. 3 to increase the reliability of detection.

Figure 3:
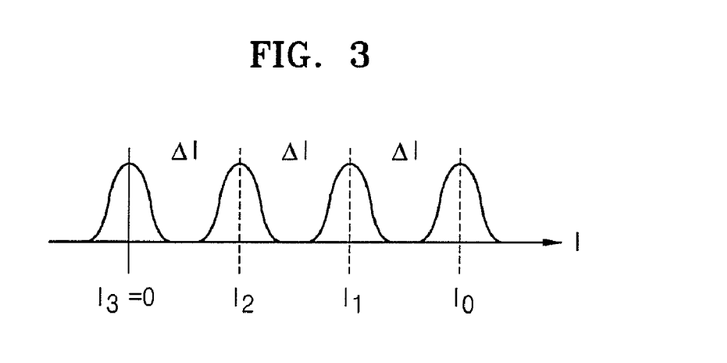
FIG. 3 is a graph showing the sizes of a first current through a fourth current with respect to states shown in FIG. 2.

Referring to FIG. 3, which illustrates a graph showing the sizes of the first current I0 through the fourth current I4 with respect to the states "0" through "3" shown in FIG. 2, each difference between the first current I0 and the second current I1, between the second current I1 and the third current I2, and the third current I2 and the fourth current I3 is ΔI. When the valid line lengths l1, l2, and l3 of the fuse lines FL1, FL2, and FL3 are "1/3", "1/2", and "1", respectively, and the conductance of the fuse lines FL1, FL2, and FL3 are "3G", "2G", and "G", respectively, as mentioned above, the multilevel one-time programmable memory device may have a current distribution as shown in FIG. 3.

Figure 4:
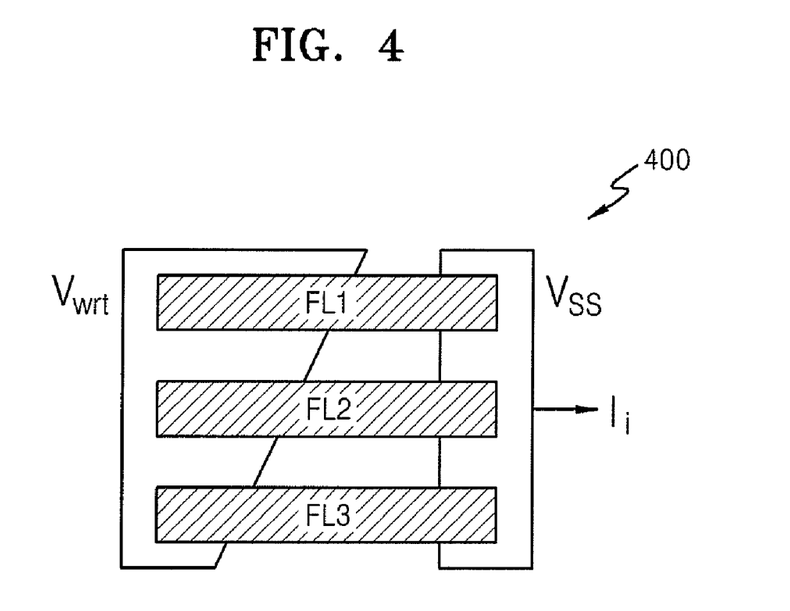
FIG. 4 is a view of a memory cell structure of a multilevel one-time programmable memory device according to an exemplary embodiment of the inventive concept.

FIG. 4 is a view of a memory cell structure of a multilevel one-time programmable memory device according to another embodiment of the inventive concept.

Referring to FIG. 4, a memory cell 400 of the multilevel one-time programmable memory device includes the first electrode 120 which is inclined from one end to the other and is farther away from the second electrode 140, whereas the memory cell 100 shown in FIG. 1 includes the first electrode 120 having the stair shape. That is, a distance between the first electrode 120 and the second electrode 140 of the memory cell 400 is different from that shown in FIG. 1, thereby realizing the same operation and effect as those of the memory cell 100 shown in FIG. 1.

Figure 5:
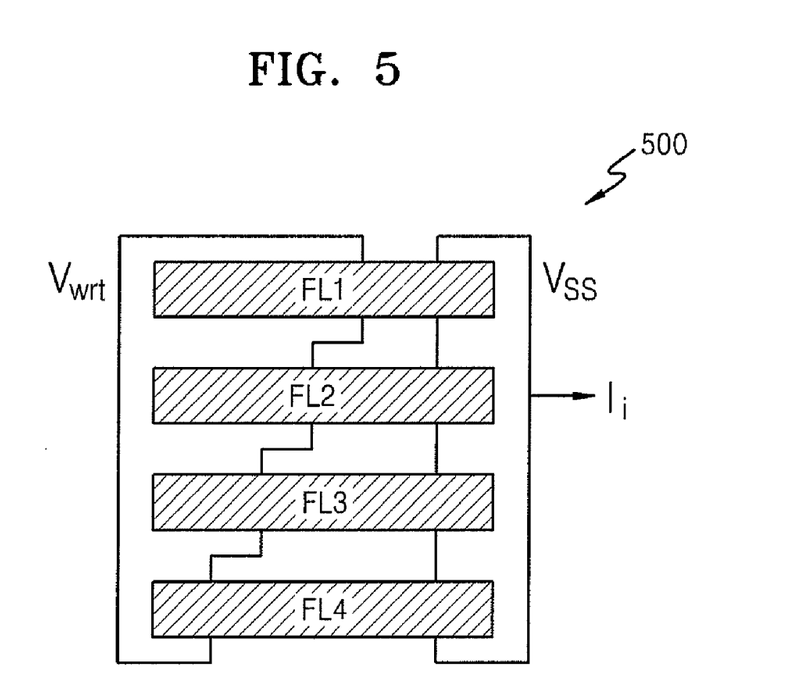
FIG. 5 is a view of a memory cell structure of a multilevel one-time programmable memory device according to an exemplary embodiment of the inventive concept.

Although the memory cells 100 and 400 include the three fuse lines FL1, FL2, and FL3 with reference to FIGS. 1 through 4, the inventive concept is not limited thereto. A memory cell 500 of a multilevel one-time programmable memory device shown in FIG. 5 includes four fuse lines FL1, FL2, FL3, and FL4. A memory cell may also include five or more fuse lines, to have a data value of required bits.

In the memory cell structure of the multilevel one-time programmable memory device of the present embodiment, first and second electrodes have different distances therebetween and thus the fuse lines which are connected to each other in parallel between first and second electrodes have different resistances. Thus, if a write voltage having different sizes is applied to the first electrode, the multilevel one-time programmable memory device can store data values of different states, and can be readily realized at high density and low cost.

Figure 6A:
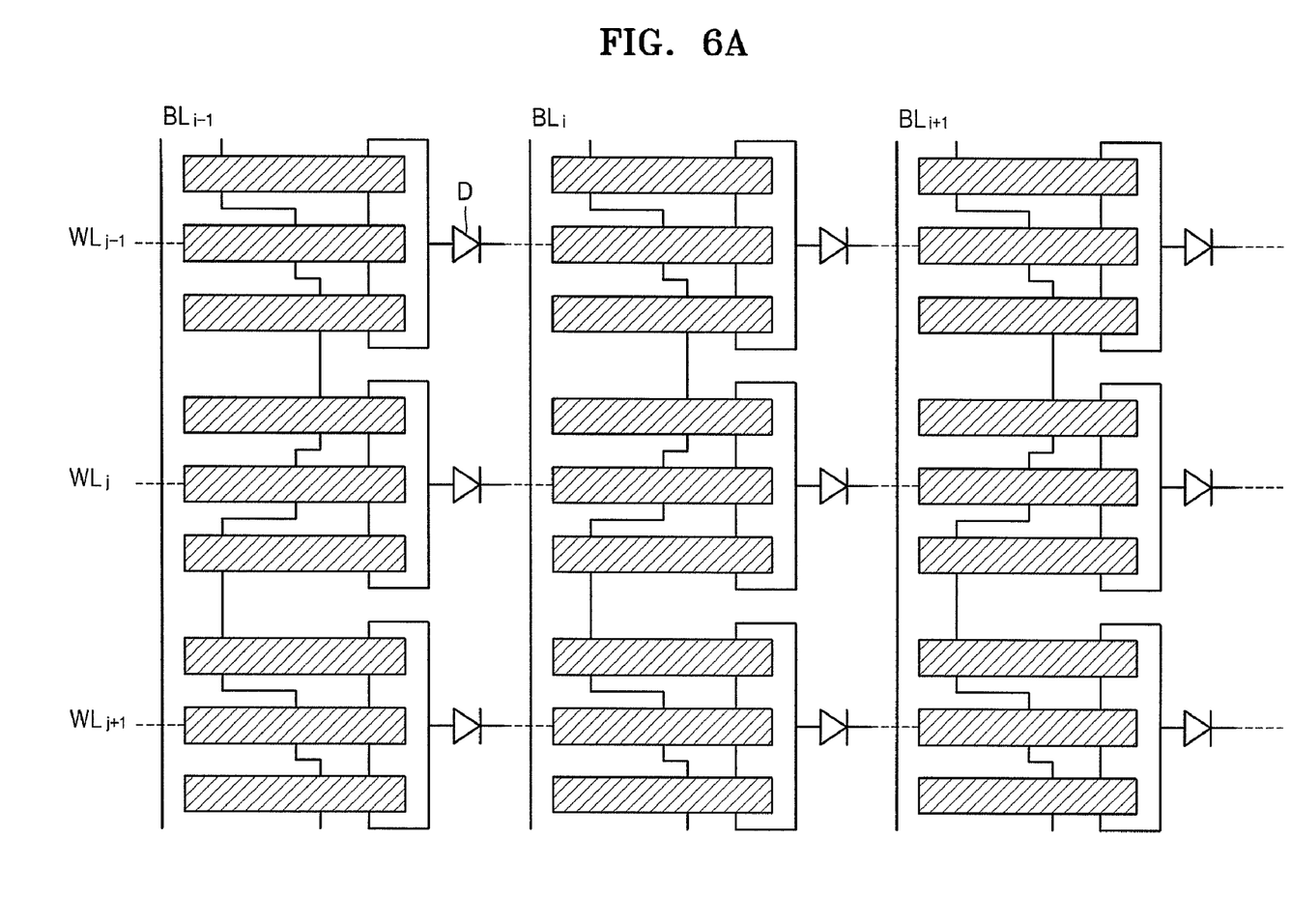
FIGS. 6A and 6B are views of a memory cell array structure of a multilevel one-time programmable memory device including memory cells shown in FIG. 1 according to an exemplary embodiment of the inventive concept.
Figure 6B:
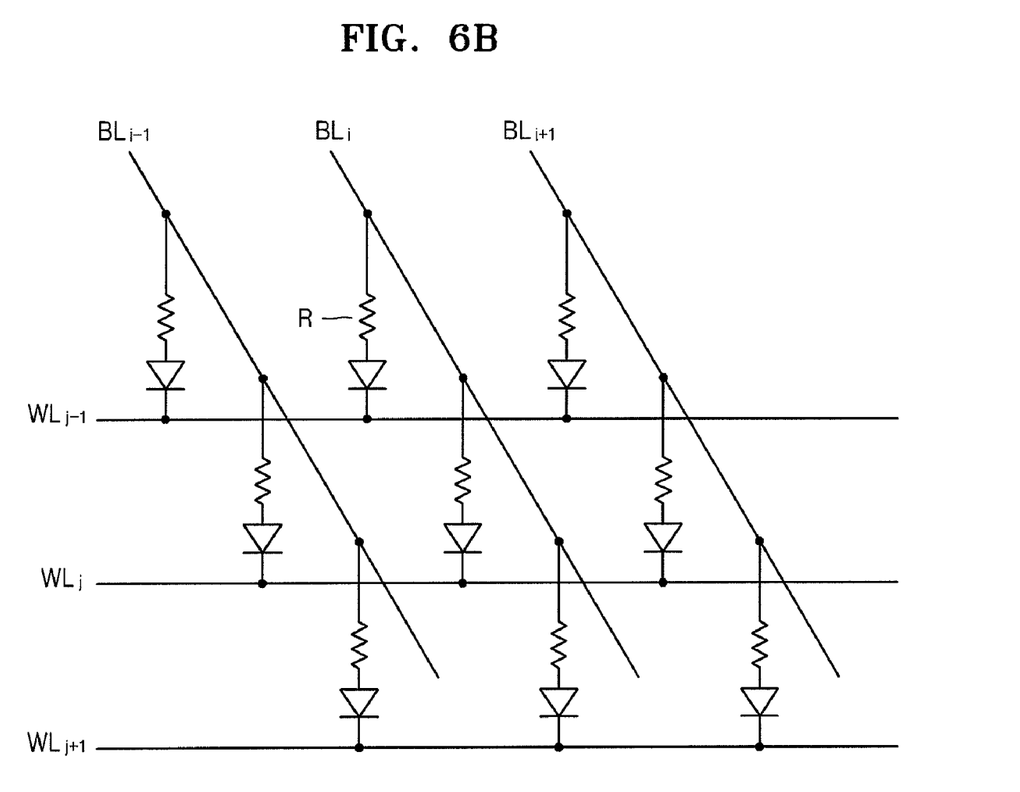

FIGS. 6A and 6B are views of a memory cell array structure of a multilevel one-time programmable memory device including the memory cells shown in FIG. 1 according to an embodiment of the inventive concept.

Referring to FIG. 6A, the memory cells shown in FIG. 1 may be connected to each other between bit lines BLi−1, BLi, and BLi+1 and word lines WLj−1, WLj, and WLj+1. Each memory cell may include three fuse lines. The multilevel one-time programmable memory device of the present embodiment may remove crosstalk by connecting the memory cells each including a diode D to the word lines WLj−1, WLj, and WLj+1.

Referring to FIG. 6B, resistances R denote the memory cells included in the memory cell array shown in FIG. 6A.

Figure 7A:
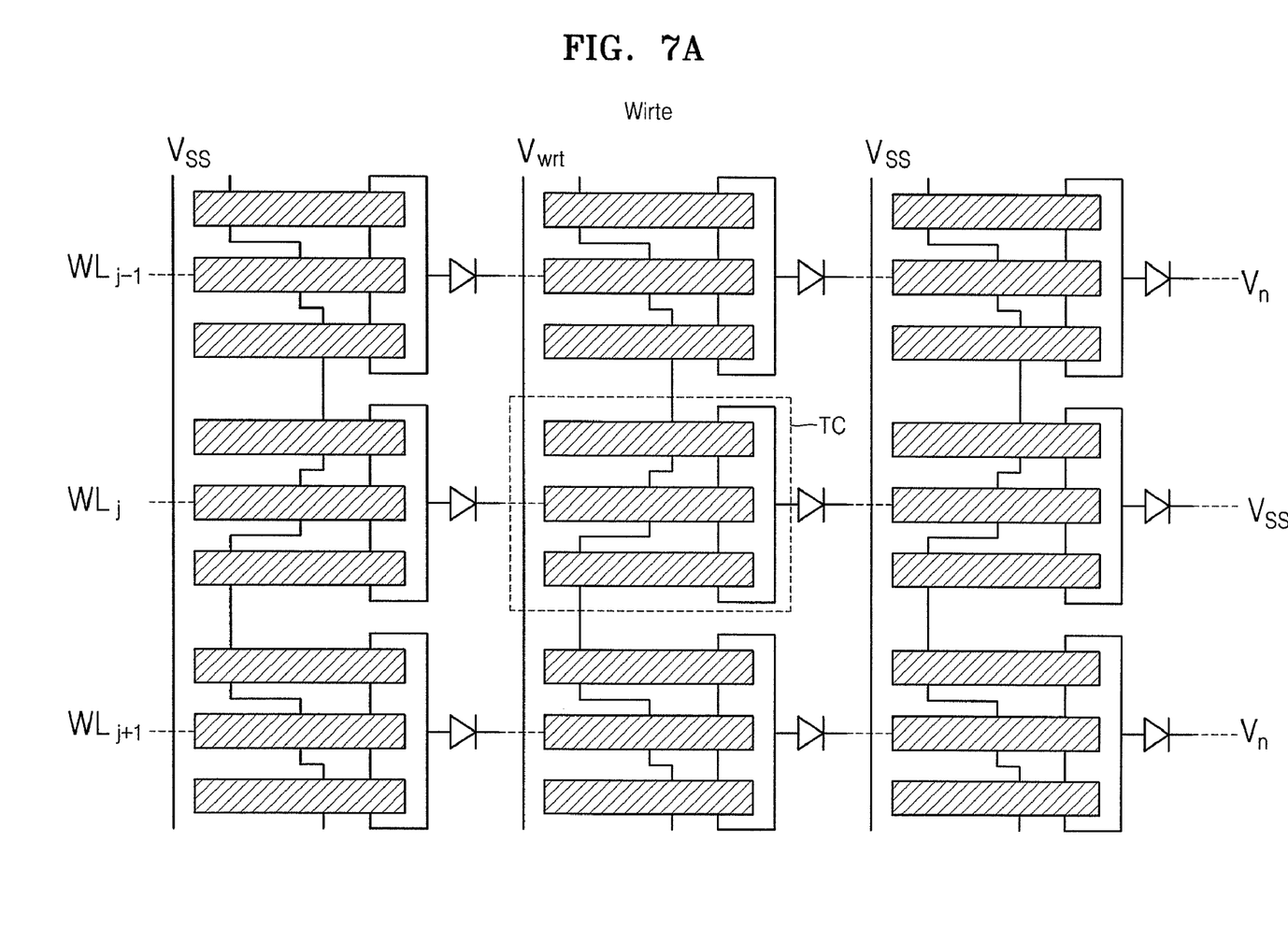
FIGS. 7A and 7B are views for explaining write and read operations with respect to the memory cell array shown in FIGS. 6A and 6B.
Figure 7B:
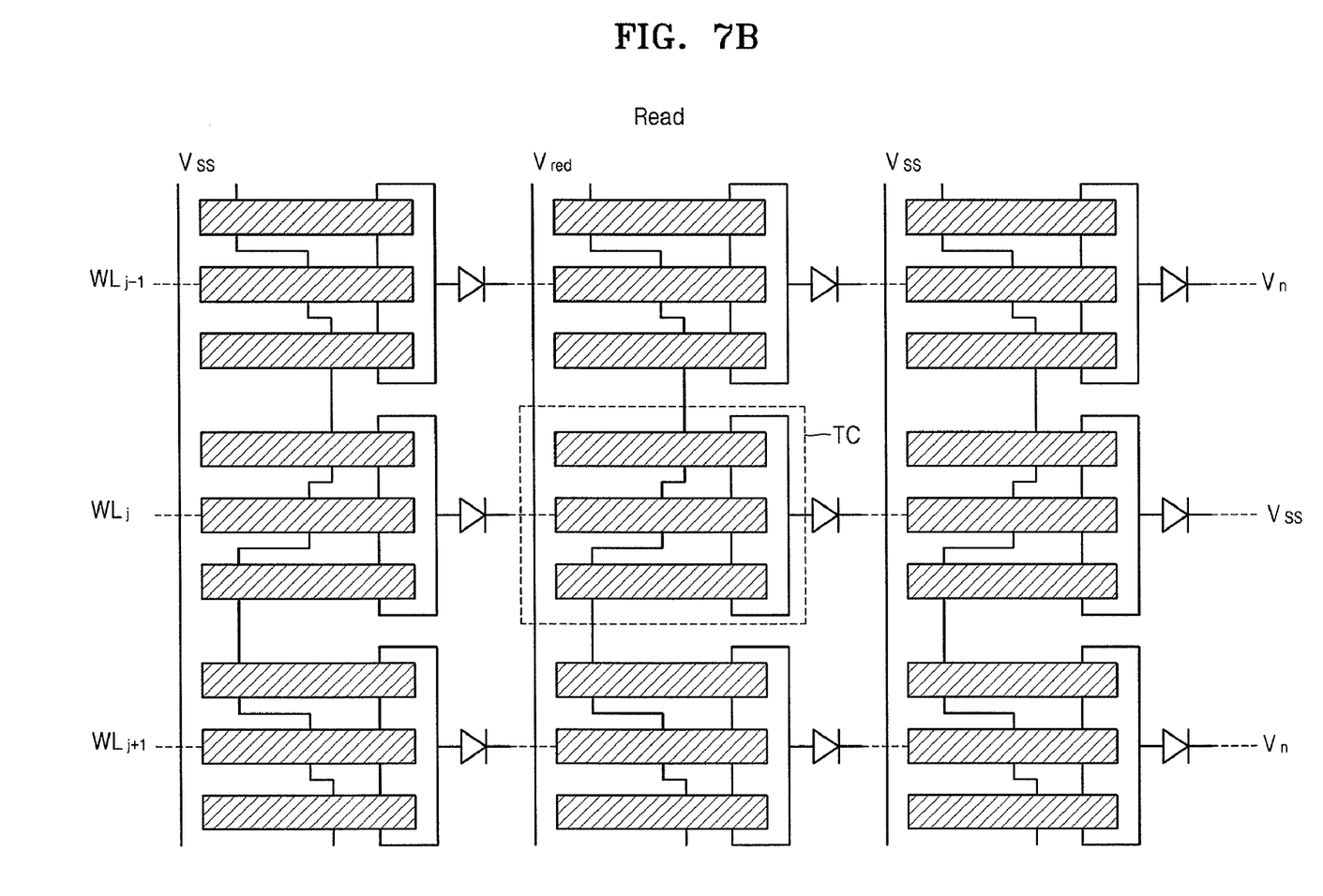

FIGS. 7A and 7B are views for explaining write and read operations with respect to the memory cell array shown in FIGS. 6A and 6B.

Referring to FIG. 7A, a ground voltage Vss is applied to a word line connected to a target cell TC, and a first voltage Vn lower than a write voltage Vwrt is applied to other word lines to write data onto the target cell TC. The write voltage Vwrt is applied to a bit line connected to the target cell TC and the ground voltage Vss is applied to other bit lines.

In this case, a diode of the target cell TC is turned on by a forward bias, and diodes of other cells are turned off by an inverse bias. Thus, a data value is written onto the target cell TC according to whether the fuse lines are turned on/off by the write voltage Vwrt shown in FIG. 2.

Referring to FIG. 7B, the ground voltage Vss is applied to the word line connected to the target cell TC, and the first voltage Vn lower than the write voltage Vwrt is applied to other word lines to read the data from the target cell TC. A read voltage Vred is applied to the bit line connected to the target cell TC and the ground voltage Vss is applied to other bit lines. In this regard, the read voltage Vred is lower than the first voltage Vn.

In the multilevel one-time programmable memory device of the present embodiment, first and second electrodes have different distances therebetween and thus the memory cell in which the fuse lines which are connected to each other in parallel between first and second electrodes have different resistances include diodes connected to the corresponding word lines. Thus, the multilevel one-time programmable memory device of the present embodiment can be readily realized at high density and low cost, and can be stably operated by preventing a malfunction due to crosstalk between adjacent cells.

Figure 8:
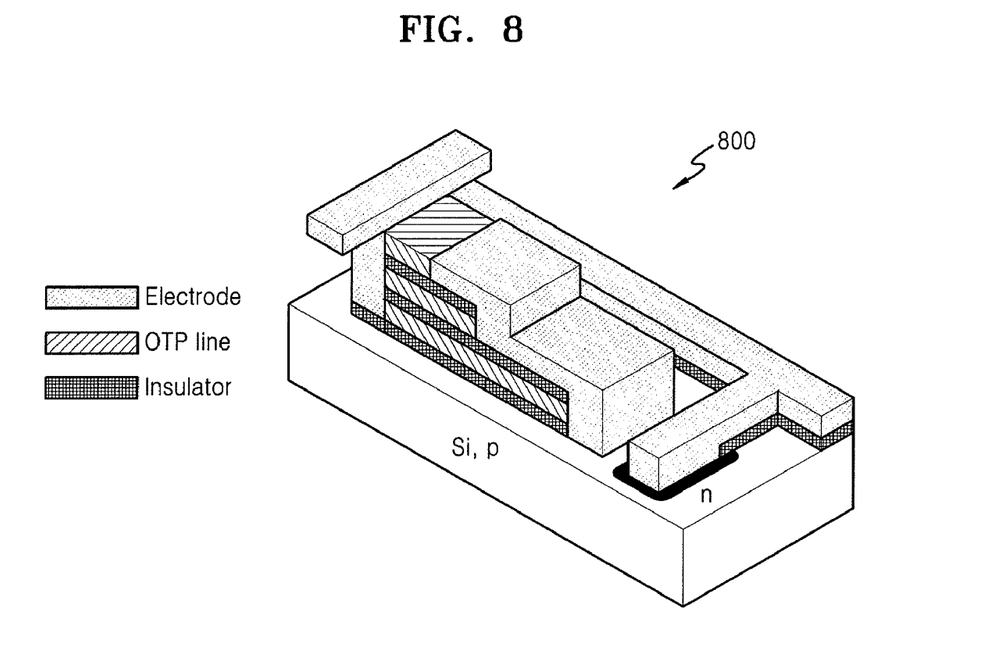
FIG. 8 is a view of a memory cell structure of a multilevel one-time programmable memory device having a multilayer structure according to an exemplary embodiment of the inventive concept.
Figure 9:
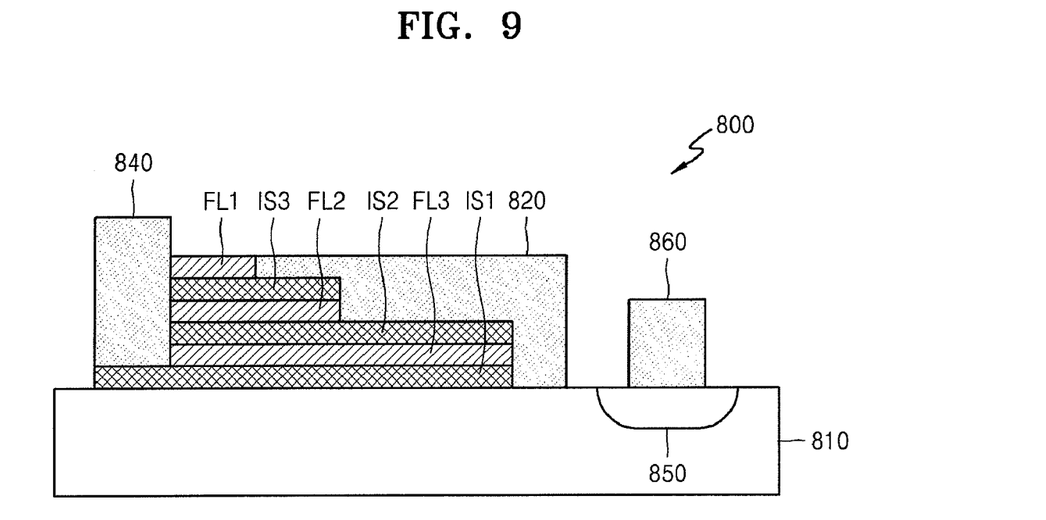
FIG. 9 is a cross-sectional view of the memory cell shown in FIG. 8.

FIG. 8 is a view of a memory cell structure of a multilevel one-time programmable memory device having a multilayer structure according to an embodiment of the inventive concept. FIG. 9 is a cross-sectional view of the memory cell 800 shown in FIG. 8.

Referring to FIGS. 8 and 9, the memory cell 800 of the multilevel one-time programmable memory device having the multilayer structure of the present embodiment includes a first insulation layer IS1 formed on a substrate 810 and a third fuse line FL3 formed on the first insulation layer IS1. A second insulation layer IS2 is formed on the third fuse line FL3. A second fuse line FL2 having a shorter valid line length than the third fuse line FL3 is formed on the second insulation layer IS2. A third insulation layer IS3 is formed on the second fuse line FL2. A first fuse line FL1 having a shorter valid line length than the second fuse line FL2 is formed on the third insulation layer IS3.

The first through third fuse lines FL1, FL2, and FL3 are connected to each other in parallel between a first electrode 820 and a second electrode 840. In this regard, the second electrode 840 may be formed on the first insulation layer IS1. The first electrode 820 is formed on the substrate 810. The first through third fuse lines FL1, FL2, and FL3 may have different valid line lengths by etching the first through third insulation layers IS1, IS2, and IS3 and the first through third fuse lines FL1, FL2, and FL3. The first electrode 820 shown in FIGS. 8 and 9 is in the shape of a cubic stair.

The substrate 810 is formed of, for example, p type silicon. For example, an n region 850 may be formed in the substrate 810 by doping with n type impurities. The n region 850 may be operated as a diode as described with reference to FIG. 6. A third electrode 860 is formed on the n region 850 and may be connected to a word line.

The multilevel one-time programmable memory device having the multilayer structure of the present embodiment can reduce an area by about ⅓ compared to the multilevel one-time programmable memory device shown in FIG. 1.

The inventive concept is not limited to the multilevel one-time programmable memory device having the multilevel structure shown in FIG. 8. Various modifications to multilevel one-time programmable memory devices having a multilayer structure are shown in FIGS. 10 and 11 and may be applied to the inventive concept.

Figure 10:
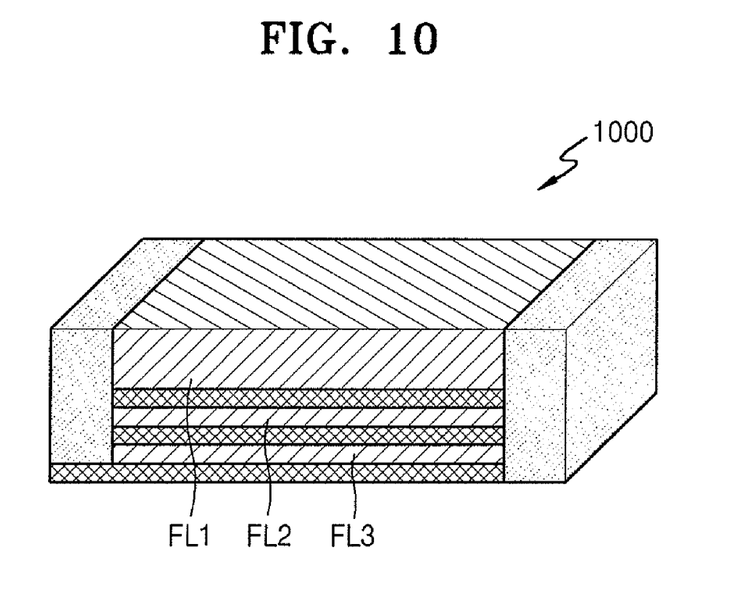
FIG. 10 is a view of a memory cell structure of a multilevel one-time programmable memory device having a multilayer structure according to an exemplary embodiment of the inventive concept.

FIG. 10 is a view of a memory cell structure of a multilevel one-time programmable memory device having a multilayer structure according to another embodiment of the inventive concept. Referring to FIG. 10, a memory cell 1000 of the multilevel one-time programmable memory device having the multilayer structure may include fuse lines FL1, FL2, and FL3 having different conductances due to the fuse lines FL1, FL2, and FL3 having different areas (refer to Equation 1). For example, if an area of the third fuse line FL3 is A, areas of the first and second fuse lines FL1 and FL2 may be 3A and 2A, respectively.

Figure 11:
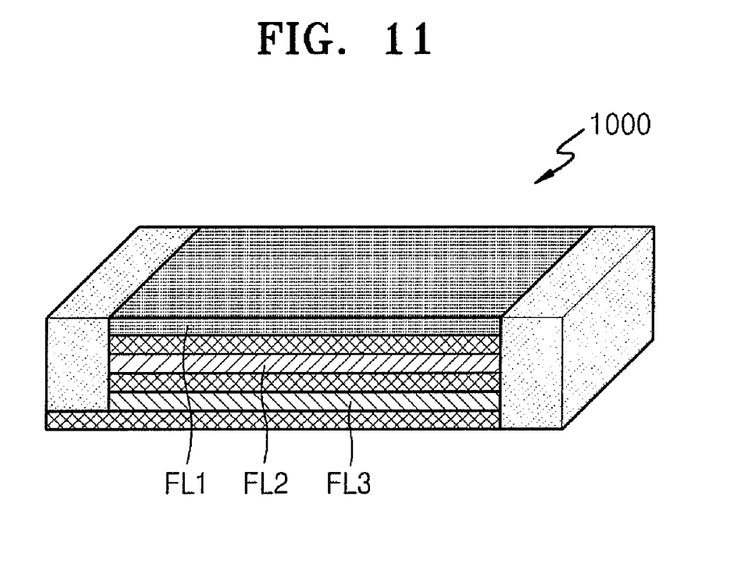
FIG. 11 is a view of a memory cell structure of a multilevel one-time programmable memory device having a multilayer structure according to an exemplary embodiment of the inventive concept.

FIG. 11 is a view of a memory cell structure of a multilevel one-time programmable memory device having a multilayer structure according to another embodiment of the inventive concept. Referring to FIG. 11, a memory cell 1100 of the multilevel one-time programmable memory device having the multilayer structure may include fuse lines FL1, FL2, and FL3 having different conductances due to the fuse lines FL1, FL2, and FL3 having different resistance rates (refer to Equation 1). For example, if a resistance ratio of the third fuse line FL3 is $\rho$, resistance rates of the first and second fuse lines FL1 and FL2 may be $\rho/3$ and $\rho/2$, respectively.

Figure 12:
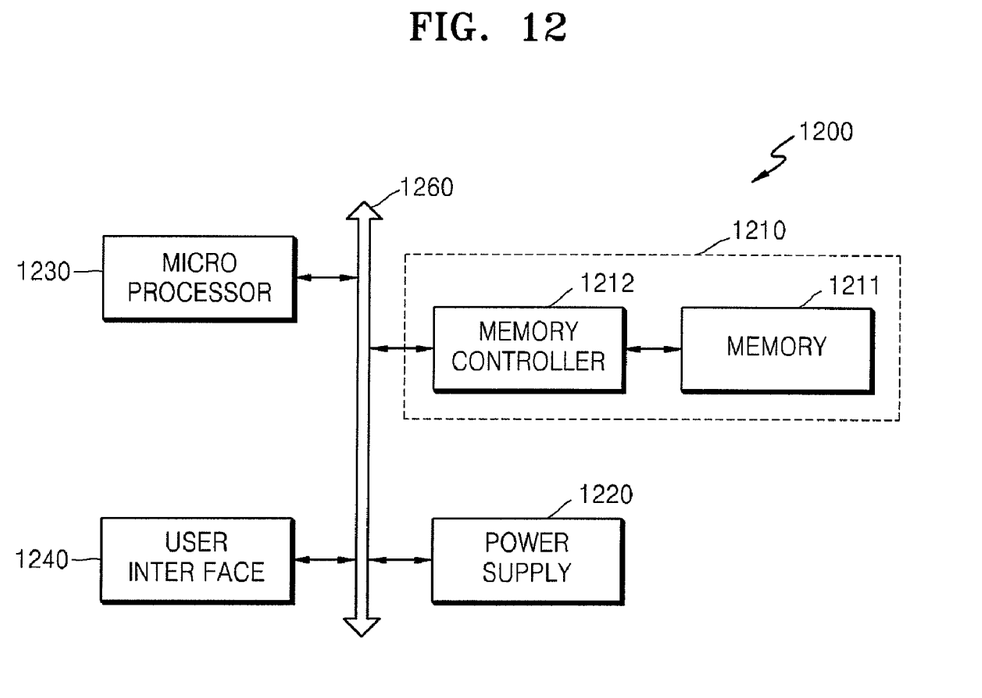
FIG. 12 is a block diagram of a computing system device including a multilevel one-time programmable memory device according to an exemplary embodiment of the inventive concept.

FIG. 12 is a block diagram of a computing system device 1200 including a multilevel one-time programmable memory device 1211 according to an embodiment of the inventive concept.

Referring to FIG. 12, the computing system device 1200 may include, for example, a microprocessor 1230 that is electrically connected to a bus 1260, a user interface 1240, and a memory system device 1210 including a memory controller 1212 and the multilevel one-time programmable memory device 1211. The multilevel one-time programmable memory device 1211 may store N-bit data (N is an integer greater than 1) that has been processed and that is to be processed by the microprocessor 1230 through the memory controller 1212. The computing system device 1200 may further include a power supply unit 1220.

While the inventive concept has been particularly shown and described with reference to exemplary embodiments thereof, it will be understood that various changes in form and details may be made therein without departing from the spirit and scope of the following claims.

What is claimed is:

1. A multilevel one-time programmable memory device including a plurality of memory cells, wherein each of the plurality of memory cells comprises:
    a first electrode to which a first voltage is applied;
    a second electrode to which a second voltage is applied; and
    a first fuse line, a second fuse line and a third fuse line performing a fusing operation according to a voltage difference between the first electrode and the second electrode, wherein the first fuse line, the second fuse line and the third fuse line are connected to each other in parallel between the first electrode and the second electrode in a multilayer structure, and wherein the first fuse line, the second fuse line and the third fuse line have different resistances from each other, and wherein the multilayer structure of each of the memory cells comprises: a first insulation layer formed on a substrate and the third fuse line formed on the first insulation layer, a second insulation layer formed on the third fuse line, the second fuse line formed on the second insulation layer, a third insulation layer formed on the second fuse line, and the first fuse line formed on the third insulation layer, and wherein the second electrode is foamed on the first insulation layer and the first electrode is formed on the substrate.

2. The device of claim 1, wherein at least one of the first electrode and the second electrode is formed such that the first electrode and the second electrode have different valid line lengths therebetween so that the first fuse line, the second fuse line and the third fuse line have different resistance ratios from each other.

3. The device of claim 2, wherein one surface of the first electrode that faces the second electrode has a stair shape.

4. The device of claim 1, wherein the first fuse line, the second fuse line and the third fuse line have different areas or resistance ratios from each other.

5. The device of claim 1, wherein each of the plurality of memory cells further comprises: a diode connecting one of the first electrode and the second electrode and a corresponding word line among a plurality of word lines of the multilevel one-time programmable memory device.

6. A memory system device comprising:
    the multilevel one-time programmable memory device of claim 1; and a memory controller controlling an operation of writing data to the multilevel one-time programmable memory device and an operation of reading the data from the multilevel one-time programmable memory device.

7. The device of claim 1, wherein the second fuse line has a shorter valid line length than the third fuse line, and wherein the first fuse line has a shorter valid line length than the second fuse line.

8. The device of claim 1, wherein the first electrode has a shape of a cubic stair.

9. The device of claim 1, wherein the substrate is formed on p type silicon and an n region is formed in the substrate.

10. The device of claim 9, further comprising a third electrode foamed on the n region and connected to a word line and wherein the n region operates as a diode.

11. The device of claim 6, wherein the multilevel one-time programmable memory device is adapted to store N-bit data (N is an integer greater than 1) that has been processed and that is to be processed by a microprocessor through the memory controller.

* * * * *